(12) United States Patent
Akimoto

(10) Patent No.: US 10,437,377 B2
(45) Date of Patent: Oct. 8, 2019

(54) DISPLAY DEVICE

(71) Applicant: Japan Display Inc., Tokyo (JP)

(72) Inventor: Hajime Akimoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 437 days.

(21) Appl. No.: 15/285,523

(22) Filed: Oct. 5, 2016

(65) Prior Publication Data

US 2017/0139526 A1 May 18, 2017

(30) Foreign Application Priority Data

Nov. 18, 2015 (JP) .................................. 2015-225448

(51) Int. Cl.
*G06F 3/041* (2006.01)
*G06F 3/044* (2006.01)
(Continued)

(52) U.S. Cl.
CPC ............ *G06F 3/0416* (2013.01); *G06F 3/044* (2013.01); *G06F 3/0412* (2013.01);
(Continued)

(58) Field of Classification Search
CPC ...... G06F 3/0416; G06F 3/0412; G06F 3/044; G06F 3/047; G06F 2203/04102; G06F 3/0448; H01L 27/323
See application file for complete search history.

(56) References Cited

U.S. PATENT DOCUMENTS

2008/0142352 A1* 6/2008 Wright .................... G06F 3/044
200/600

2010/0253651 A1* 10/2010 Day ........................ G06F 3/044
345/175
(Continued)

FOREIGN PATENT DOCUMENTS

JP 2005-140918 A 6/2005
JP 2013-168121 A 8/2013
(Continued)

OTHER PUBLICATIONS

Korean Office Action dated Jul. 19, 2018 for the corresponding Korean Patent Application No. 10-2016-0148223, with partial English translation.
(Continued)

*Primary Examiner* — William Boddie
*Assistant Examiner* — Saifeldin E Elnafia
(74) *Attorney, Agent, or Firm* — Michael Best & Friedrich LLP

(57) ABSTRACT

Provided is a high image quality display device including a touch panel. A display device includes a substrate; a display region provided on the substrate, the display region including an array of a plurality of pixels each including at least one light-emitting element; a scanning line driving circuit; a video signal driving circuit; a common electrode commonly provided for the plurality of light-emitting elements, the common electrode being divided into a plurality of divided areas extending in a radial direction in the display region; and a voltage switch circuit connected with the plurality of divided areas of the common electrode, the voltage switch circuit selectively connecting each of the plurality of divided areas of the common electrode with a reference power supply circuit supplying a constant potential or a scanning circuit detecting a touch position in the display region.

19 Claims, 12 Drawing Sheets

(51) Int. Cl.
    *H01L 27/32* (2006.01)
    *G06F 3/047* (2006.01)
(52) U.S. Cl.
    CPC .......... *G06F 3/0448* (2019.05); *H01L 27/323* (2013.01); *G06F 3/047* (2013.01); *G06F 2203/04102* (2013.01)

(56) References Cited

U.S. PATENT DOCUMENTS

| | | | |
|---|---|---|---|
| 2012/0075226 A1* | 3/2012 | Andoh | .................... G06F 3/046 |
| | | | 345/173 |
| 2013/0215049 A1 | 8/2013 | Lee | |
| 2014/0152616 A1 | 4/2014 | Kida et al. | |
| 2014/0160179 A1 | 6/2014 | Ishii et al. | |
| 2014/0253493 A1* | 9/2014 | Cho | .................... G06F 3/0412 |
| | | | 345/174 |
| 2015/0293630 A1 | 10/2015 | Ishizaki et al. | |
| 2017/0076659 A1* | 3/2017 | Zhang | ................. G09G 3/3208 |

FOREIGN PATENT DOCUMENTS

| | | |
|---|---|---|
| JP | 2013-214329 A | 10/2013 |
| JP | 2014-132446 A | 7/2014 |
| JP | 2015-204032 A | 11/2015 |
| KR | 10-2014-0075591 A | 6/2014 |

OTHER PUBLICATIONS

Japanese Office Action dated Jun. 4, 2019 for the corresponding Japanese application No. 2015-225448, with partial English translation.

\* cited by examiner

DISPLAY DEVICE

CROSS REFERENCE TO RELATED APPLICATIONS

This application is based upon and claims the benefit of priority from the prior Japanese Patent Application No. 2015-225448 filed on Nov. 18, 2015, the entire contents of which are incorporated herein by reference.

FIELD

The present invention relates to a structure of a display device, and specifically to a structure of a display device including a touch panel.

BACKGROUND

An organic electroluminescence (organic EL) display device includes a light-emitting element in each of a plurality of pixels, and displays an image by controlling light emission in each of the pixels individually. The light-emitting element includes a pair of electrodes, one of which is an anode electrode and the other of which is a cathode electrode, and a layer containing an organic EL material (hereinafter, referred to also as a "light-emitting layer") held between the pair of electrodes. When electrons are injected into the light-emitting layer from the cathode electrode and holes are injected into the light-emitting layer from the anode electrode, the electrons and the holes are recombined. Extra energy released by the recombination excites, and then deexcites, light-emitting molecules in the light-emitting layer. Thus, the light-emitting elements emit light.

In such an organic EL display device, the anode electrode in each of the light-emitting elements is provided as a pixel electrode corresponding to the respective pixel, and the cathode electrode is provided as a common electrode corresponding to the plurality of pixels. The common electrode is supplied with a common potential. The organic EL display device applies a potential of the pixel electrode in each pixel with respect to the potential of the common electrode, and thus controls the light emission of each pixel.

Recently, touch panels have been widely used in electronic devices such as mobile terminals, personal computers, car navigation systems and the like. Such a touch panel is used as follows. A user touches the touch panel with his/her finger tip, a tip of a pen or the like while visually recognizing an image on a display screen of a liquid crystal display device or the like including the touch panel, and the touched position on the touch panel is detected. Thus, data is input.

For example, Japanese Laid-Open Patent Publication No. 2013-168121 discloses a touch panel. This touch panel includes a plurality of driving lines extending in a first direction, and a plurality of sensing lines extending in a second direction perpendicular to the first direction. A part of the plurality of driving lines and a part of the plurality of sensing lines are activated to perform rare scan, by which an approximate position at which the user has touched is detected. Driving lines, among the plurality of driving lines, in the vicinity of the approximate position at which the user has touched are activated, and sensing lines, among the plurality of sending lines, in the vicinity of the approximate position at which the user has touched are activated, to further perform local scan, by which a precise position at which the user has touched is detected.

SUMMARY

An embodiment according to the present invention is directed to a display device including a substrate; a display region provided on the substrate, the display region including an array of a plurality of pixels each including at least one light-emitting element; a scanning line driving circuit sequentially scanning the plurality of pixels; a video signal driving circuit sequentially inputting a video signal to the scanned plurality of pixels; a common electrode commonly provided for the plurality of light-emitting elements, the common electrode being divided into a plurality of divided areas extending in a radial direction in the display region; and a voltage switch circuit connected with the plurality of divided areas of the common electrode, the voltage switch circuit selectively connecting each of the plurality of divided areas of the common electrode with a reference power supply circuit supplying a constant potential or a scanning circuit detecting a touch position in the display region.

An embodiment according to the present invention is directed to a display device including a substrate; a display region provided on the substrate, the display region including an array of a plurality of pixels each including at least one light-emitting element; a peripheral circuit enclosing the display region; a common electrode commonly provided for the plurality of light-emitting elements, the common electrode being divided into a plurality of divided areas extending in a radial direction in the display region; and a plurality of detection electrodes located on the plurality of divided areas of the common electrode with an insulating layer being provided between the plurality of detection electrodes and the plurality of divided areas of the common electrode. The peripheral circuit includes a touch detection circuit connected with the plurality of detection electrodes; and a voltage switch circuit connected with the plurality of divided areas of the common electrode, the voltage switch circuit selectively connecting each of the plurality of divided areas of the common electrode with a reference power supply circuit supplying a constant potential or a scanning circuit detecting a touch position in the display region.

DESCRIPTION OF EMBODIMENTS

Figure 1:
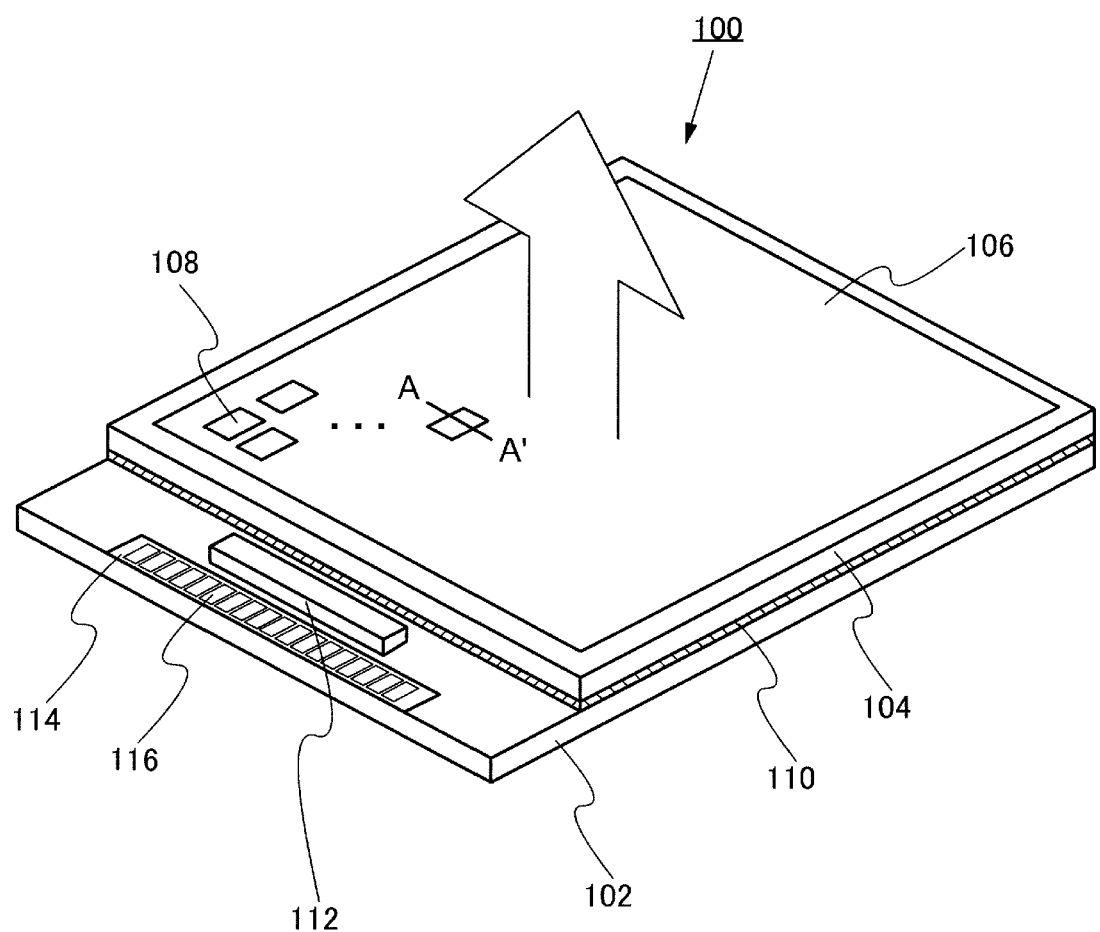
FIG. 1 is a perspective view showing a structure of a display device in an embodiment according to the present invention.

In order to realize an in-cell touch panel in an organic EL display device using substantially the same circuit configuration as that of a liquid crystal display device, it is conceivable to divide a common electrode in accordance with the pixels in advance and then sequentially scan the divided areas of the common electrode as driving lines in an image non-display period.

However, in the case where the common electrode is divided such that the divided areas are parallel to each other as in a liquid crystal display device, there occurs the following problem. In an organic EL display device, a large current flows in the common electrode from pixels to a peripheral portion of a display region in an image display period. Therefore, especially when the pixels at the center, and in the vicinity thereof, of the display region emit light, the voltage drop of the common electrode is abnormally large. This causes the shapes of the divided areas of the common electrode to be visually recognized.

Hereinafter, embodiments of the present invention will be described with reference to the drawings and the like. The present invention may be carried out in various other embodiments, and should not be construed as being limited to any of the following embodiments. In the drawings, components may be shown schematically regarding the width, thickness, shape and the like, instead of being shown in accordance with the actual sizes, for the sake of clear illustration. The drawings are merely exemplary and do not limit the interpretations of the present invention in any way. In the specification and the drawings, components that are substantially the same as those described or shown previously bear the identical reference signs thereto, and detailed descriptions thereof may be omitted.

Embodiment 1

With reference to figures, a structure of a display device 100 in this embodiment will be described.

FIG. 1 is a perspective view showing a schematic structure of the display device 100 in this embodiment. The display device 100 in this embodiment includes a first substrate 102, a second substrate 104, a plurality of pixels 108, a sealing member 110, a terminal region 114, and connection terminals 116.

The first substrate 102 has a display region 106 provided thereon. The display region 106 on the first substrate 102 includes an array of the plurality of pixels 108, each including at least one light-emitting element.

The second substrate 104 is provided on the display region 106 so as to face the first substrate 102. The second substrate 104 is secured to the first substrate 102 via the sealing member 110 enclosing the display region 106. The display region 106 formed on the first substrate 102 is sealed by the second substrate 104 and the sealing member 110 so as not to be exposed to the outside air. Such a sealing structure suppresses the light-emitting element provided in each of the plurality of pixels 108 from being deteriorated. As described below, the display device 100 includes an in-cell touch panel having a touch panel function.

The first substrate 102 has the terminal region 114 provided thereon along an end thereof. The terminal region 114 is located outer to the second substrate 104. The terminal region 114 includes the plurality of connection terminals 116. Each of the connection terminals 116 is connected with a wiring board that connects a device outputting a video signal, a power supply or the like with a display panel (in FIG. 1, display device 100). A contact of each of the connection terminals 116 with the wiring board is exposed outside. The first substrate 102 has a driver IC 112 provided thereon, which outputs a video signal input from each of the connection terminals 116 to the display region 106.

Figure 2:
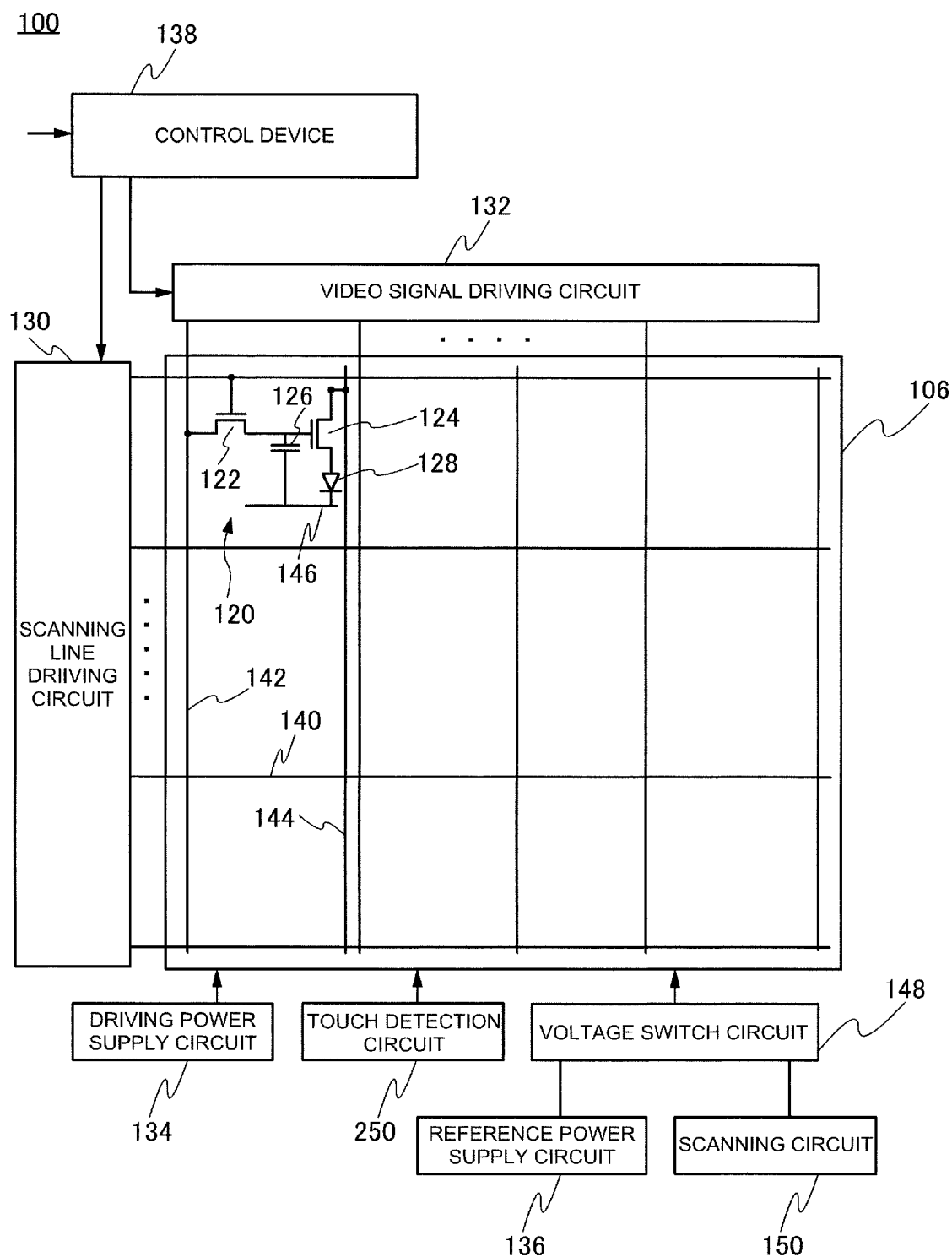
FIG. 2 is a circuit diagram showing a circuit configuration of the display device in the embodiment according to the present invention.

Now, a circuit configuration of the display device 100 in this embodiment will be described in detail with reference to a figure. FIG. 2 shows a circuit configuration of the display device 100 in this embodiment.

The display device 100 includes the display region 106 displaying an image and a driving portion driving the display region 106. The driving portion is located to enclose the display region 106, and acts as a peripheral circuit.

The display region 106 in the display device 100 includes the plurality of pixels 108 located in a matrix, and each of the plurality of pixels 108 includes a pixel circuit 120. The pixel circuit 120 includes at least a selection transistor 122, a driving transistor 124, a storage capacitance 126 and a light-emitting element 128.

The driving portion includes a scanning line driving circuit 130, a video signal driving circuit 132, a driving power supply circuit 134, a voltage switch circuit 148, a reference power supply circuit 136, a scanning circuit 150, a control device 138 and a touch detection circuit 250.

The display device 100 is driven in a display period and a non-display period repeated alternately. In the display period, the driving portion drives the pixel circuit 120 to control the light emission of the light-emitting element 128. By contrast, in the non-display period, the driving portion drives the scanning circuit 150 to detect a position at which a finger tip of a user, a touch pen or the like has touched (such a position will be referred to as a "touch position").

The scanning driving circuit 130 is connected with scanning signal lines 140 respectively provided for horizontal lines of the pixels 108 (pixel rows). The scanning driving circuit 130 sequentially scan the pixels 108. Namely, the scanning driving circuit 130 sequentially selects the scanning signal lines 140 in accordance with a timing signal input from the control device 138, and applies, to the selected scanning signal line 140, a voltage that turns on the selection transistor 122.

The video signal driving circuit 132 is connected with video signal lines 142 respectively provided for vertical lines of the pixels 108 (pixel columns). The video signal driving circuit 132 sequentially inputs a video signal to the scanned plurality of pixels 108. Namely, the video signal driving circuit 132 has a video signal input thereto from the control device 138. In response to the selection of the scanning signal line 140 by the scanning line driving circuit 130, the video signal driving circuit 132 outputs a voltage corresponding to the video signal of the selected pixel row to each of the video signal lines 142. The voltage is written to the storage capacitances 126 in the selected pixel row via the selection transistors 122 in the selected pixel row. The driving transistor 124 supplies a current corresponding to the written voltage to the light-emitting elements 128. As a result, the light-emitting elements 128 in the pixels corresponding to the selected scanning signal line 140 emit light.

The driving power supply circuit 134 is connected with power supply potential lines 144 respectively provided for the pixel columns, and supplies a current to the light-emitting elements 128 in the selected pixel row via the power supply potential lines 144 and the driving transistors 124 in the selected pixel row.

The voltage switch circuit 148 is connected with a reference potential line 146.

In the display period, the reference potential line 146 is connected with the reference power supply circuit 136 via the voltage switch circuit 148. Namely, the reference power supply circuit 136 is connected with the reference potential line 146 via the voltage switch circuit 148. The reference power supply circuit 136 provides the common electrode acting as the cathode electrode of the light-emitting element 128 with a constant potential. The constant potential may be set to, for example, the ground potential.

In the non-display period, the reference potential line 146 is connected with the scanning circuit 150 via the voltage switch circuit 148. Namely, the scanning circuit 150 is connected with the reference potential line 146 via the voltage switch circuit 148.

Figure 3:
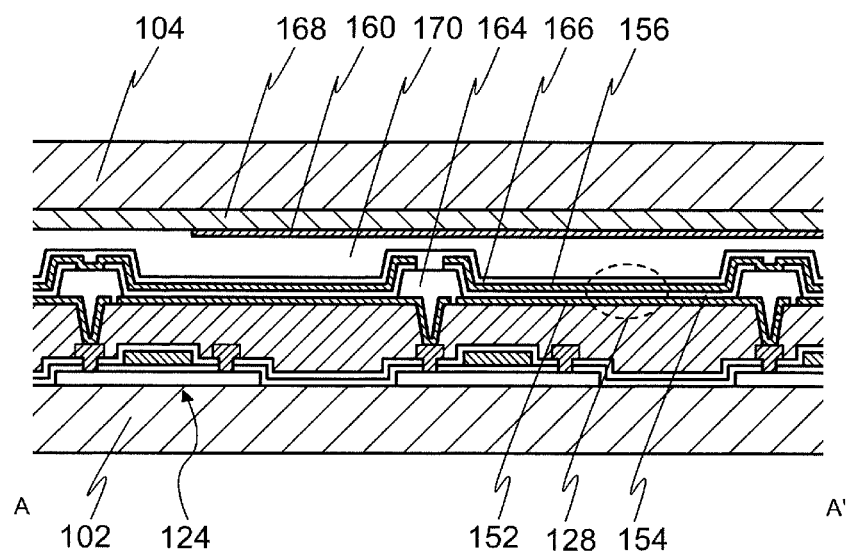
FIG. 3 is a cross-sectional view showing a structure of a pixel included in the display device in the embodiment according to the present invention.
Figure 4:
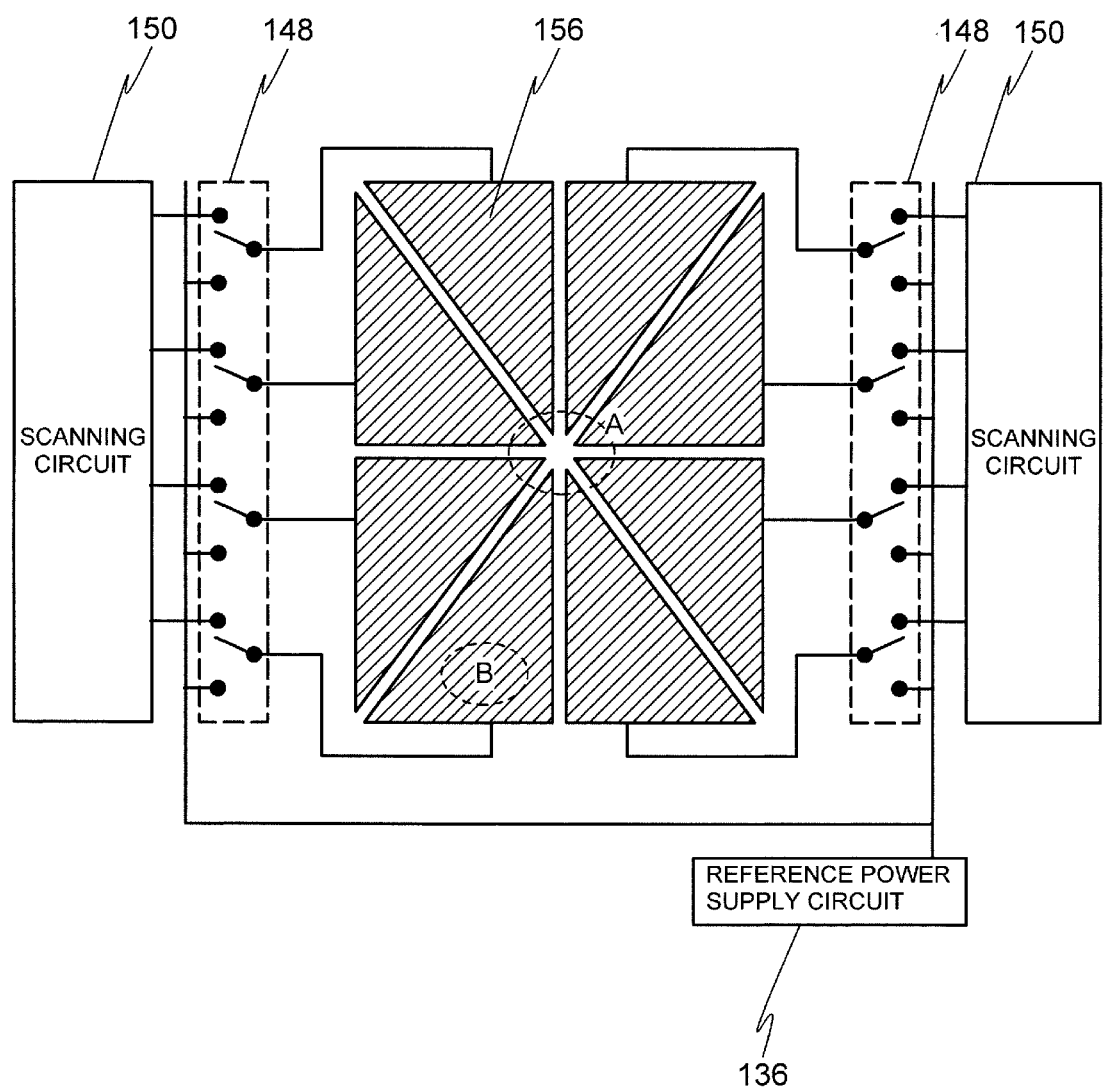
FIG. 4 is a schematic view showing a layout and a connection state of a plurality of divided common electrodes included in the display device in the embodiment according to the present invention.
Figure 5:
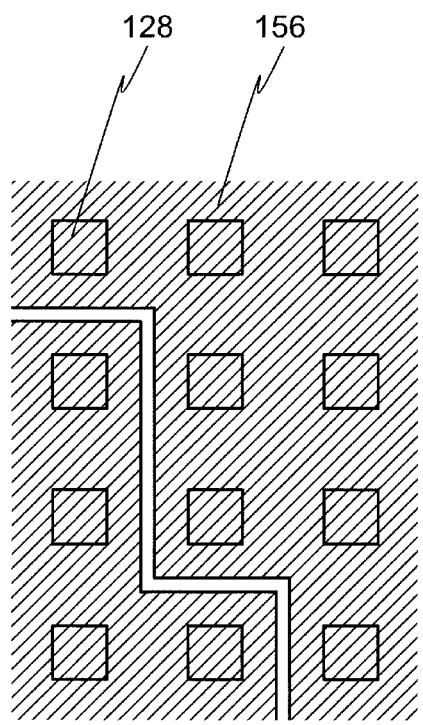
FIG. 5 is an enlarged view of end portions of the divided common electrodes included in the display device in the embodiment according to the present invention.
Figure 6:
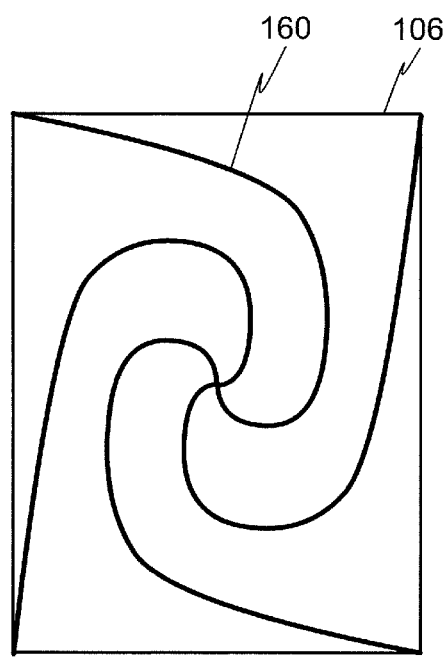
FIG. 6 is a plan view showing a layout of detection electrodes included in the display device in the embodiment according to the present invention.

Now, a layout and a connection state of the common electrode in the display device 100 in this embodiment will be described with reference to FIG. 3 through FIG. 6. FIG. 3 is a cross-sectional view showing a structure of the pixel 108 included in the display device 100 in this embodiment, and is taken along line A-A' in FIG. 1. FIG. 4 is a schematic view showing a layout and a connection state of a plurality of divided areas of the common electrode in the display device 100 in this embodiment. FIG. 5 is an enlarged view of end portions of the divided areas of the common electrode in the display device 100 in this embodiment. FIG. 6 is a plan view showing a layout of detection electrodes in the display device 100 in this embodiment.

Referring to FIG. 3, the driving transistor 124 is located in a layer below the light-emitting element 128 in each of the plurality of pixels 108. Although not shown, the selection transistor 122 is also provided in a layer below the light-emitting element 128. A bank 164 demarcating the plurality of pixels 108 is provided. On the light-emitting element 128, a sealing layer 166 is located in the entirety of the display region 106. The sealing layer 166 suppresses entrance of moisture into a light-emitting layer 154, and thus it is preferable that the sealing layer 166 contains an inorganic insulating layer.

The second substrate 104 is bonded with the first substrate 102 with the sealing member (not shown in FIG. 3) so as to face the first substrate 102 and hold the light-emitting element 128 and the like together with the first substrate 102. In this example, a circularly polarizing plate 168 and a receiving electrode (detection electrode) 160 are provided on a surface of the second substrate 104 on the side of the first substrate 102. A gap between the first substrate 102 and the second substrate 104 is filled with a filler 170.

The light-emitting element 128 includes a pixel electrode 152, a common electrode 156 and the light-emitting layer 154 held between the pixel electrode 152 and the common electrode 156. Among the electrodes included in the light-emitting element 128, the pixel electrode 152 is the lower electrode and the common electrode 156 is the upper electrode. The pixel electrode 152 is electrically connected with a source electrode of the driving transistor 124 via a contact opening.

The light-emitting element 128 is located in an opening enclosed by the bank 164 in the display region 106. Namely, the light-emitting element 128 is located in an area where the pixel electrode 152 and the light-emitting layer 154 contact each other and the pixel electrode 152 and the light-emitting layer 154 do not hold the bank 164 therebetween.

The light-emitting layer 154, in the case where being formed of, for example, an organic EL layer, is formed of a low molecular weight type organic material or a high molecular weight type organic material. In the case where a low molecular weight type organic material is used to form the light-emitting layer 154, for example, a hole injection layer/hole transfer layer and an electron transfer layer/electron injection layer are provided to sandwich the light-emitting layer 154, which contains a light-emitting organic material.

The common electrode 156 is commonly provided for the plurality of light-emitting elements 128. As shown in FIG. 4, the common electrode 156 may be divided into a plurality of areas extending in a radial direction in the display region 106. In this example, the common electrode 156 is divided into eight areas extending in a radial direction. It is preferable that the common electrode 156 is divided into about eight areas as in this embodiment. However, the common electrode 156 is not limited to being divided into eight areas. Alternatively, the common electrode 156 may be divided into a greater number of areas. In the case where the common electrode 156 is divided into a plurality of areas extending in a radial direction, the divided common electrodes 156 are each narrower in a central portion and wider in a peripheral portion of the pre-division common electrode 156. (The divided areas of the common electrode 156 will be referred to as the "divided common electrodes 156" for the sake of convenience.)

With such a structure, at the center, and in the vicinity thereof, of the pre-division common electrode 156, currents flow out from the divided common electrode 156 in the image display period. For example, referring to FIG. 4, currents flowing out from the pixels 108 in an area represented by letter A (hereinafter, referred to as "area A") are pulled out as being divided into the eight common electrodes 156. Therefore, the voltage drop of each of the divided common electrodes 156 is suppressed, and the shapes of the divided common electrodes 156 are made difficult to be visually recognized. Thus, the display device 100 provides a high quality image.

FIG. 5 is an enlarged view of end portions of the divided common electrodes 156. As shown in FIG. 5, the common electrode 156 is divided into a plurality of areas so as not to divide the light-emitting elements 128. Namely, the common electrode 156 is divided into a plurality of areas on the basis of the pixels 108. The common electrodes 156 having such a layout may be formed of, for example, photolithography or laser irradiation. Especially in the case where laser irradiation is used, the light-emitting layer 154 located just below the common electrodes 156 is also cut. Therefore, the color mixing between adjacent pixels 108 is prevented.

At least one of the plurality of divided common electrodes 156 may be triangular or quadrangular. In this example, all the eight divided common electrodes 156 has a shape of right triangle.

With such a structure, each of the divided common electrodes 156 has a width that becomes larger as being farther from the center of the pre-division common electrode 156. This suppresses the voltage drop of each of the divided common electrodes 156 in the display period. For example, referring to FIG. 4, currents flowing out from the pixels 108 in an area represented by letter B (hereinafter, referred to as "area B") are all pulled out from one divided common electrode 156. However, the divided common electrode 156 is wider in area B than in area A. Therefore, area B has a lower resistance and thus suppresses the voltage drop. For this reason, the shapes of the divided common electrodes 156 are made difficult to be visually recognized. Thus, the display device 100 provides a high quality image. In addition, area B is close to a low-resistance line formed of a metal material that connects the divided common electrode 156 and the voltage switch circuit 148 to each other. Therefore, the voltage drop is small and thus the problem of visibility is not serious.

The plurality of divided common electrodes 156 extending in a radial direction may extend in a radial direction from a position that is substantially the center of the display region 106. In this example, the eight divided common electrodes 156 extend from the center of the display region 106.

With such a structure, at the center, and in the vicinity thereof, of the display region 106 (namely, in the central portion of the display region 106), currents are pulled out from the plurality of divided common electrodes 156 in the image display period. Therefore, the voltage drop of each of the divided common electrodes 156 is suppressed and thus the shapes of the divided common electrodes 156 are made difficult to be visually recognized. Thus, the display device 100 provides a high quality image.

It is preferable that the common electrode 156 is formed of a transparent conductive material that is light-transmissive and conductive such as ITO (tin oxide-containing indium oxide), IZO (indium oxide-zinc oxide) in order to allow light emitted from the light-emitting layer 154 to be transmitted through the common electrode 156. Alternatively, the common electrode 156 may be formed of a metal layer that is sufficiently thin to allow the light emitted from the light-emitting layer 154 to be transmitted through the metal layer, for example, a film formed of Mg, Ag or the like having a thickness of about 1 to 10 nm.

It is preferable that the pixel electrode 152 contains a metal layer having a high reflectance in order to allow light emitted from the light-emitting layer 154 to be reflected toward the common electrode 156. The metal layer may be formed of, for example, silver (Ag).

As shown in FIG. 4, the voltage switch circuit 148 is connected with the plurality of divided common electrodes 156. The voltage switch circuit 148 selectively connects each of the divided common electrodes 156 with the reference power supply circuit 136 supplying a constant voltage or with the scanning circuit 150 detecting the touch position in the display device 106.

Such a structure realizes an in-cell tough panel in the display device 100 including the light-emitting elements 128.

In the non-display period, the voltage switch circuit 148 selects a scanning voltage for driving the electrodes of the touch panel. In this state, the divided common electrodes 156 act as scanning electrodes 158 of the touch panel. The detection electrodes 160 crossing the scanning electrodes 158 may be provided in the display region 106. A driving signal for detecting the touch position such as a pulse-like signal or the like from the scanning circuit 150 pass, while scanning, each of the scanning electrodes 158. This driving signal is received by each of the detection electrodes 160 by capacitive coupling to become a detection signal, and the touch detection circuit 250 connected with the detection electrode 160 detects the touch position based on the detection signal. Thus, the scanning electrodes 158 are each a scanning electrode for detecting a touch position, and the detection electrodes 160 are each a detection electrode for detecting a touch position.

Such a structure realizes an electrostatic capacitance-type touch panel in the display device 100 including the light-emitting elements 128.

As shown in FIG. 6, in this example, the detection electrodes 160 are located in a spiral pattern.

With such a structure, the plurality of divided common electrodes 156 extending in a radial direction and the plurality of detection electrodes 160 cross each other substantially perpendicularly at a great number of positions. This realizes a precise electrostatic capacitance-type touch panel. The structure also allows an end of each of the detection electrodes 160 to extend to an edge of the display region 106. Thus, the detection electrodes 160 and the scanning circuits 150 are easily connected with each other, which makes it unnecessary to use another line layer.

In this example, the divided common electrodes 156 each act as a transmission electrode (scanning electrode) 158 of the touch panel, and the detection electrode 160 is provided above each scanning electrode.

Even in the case where the divided common electrodes 156 are used as the detection electrodes 160 and the scanning electrodes 158 are located above the detection electrodes 160, the touch panel functions theoretically. However, in the case where the divided common electrodes 156 are used as the detection electrodes 160, a large parasitic capacitance is connected. Therefore, a change in the capacitance caused by a touch on the touch panel becomes very small, and it is difficult to detect the touch position. For this reason, it is preferable that as in this embodiment, the divided common electrodes 156 are used as the scanning electrodes 158 of the touch panel, and that the detection electrodes 160 are provided above the scanning electrodes 158.

With such a structure, an in-cell touch panel having a sufficiently high sensitivity is realized.

The structure of the display device 100 in this embodiment is described above. The display device 100 in this embodiment including the light-emitting elements 128, which are of a self light-emitting type, includes an in-cell touch panel. The shapes of the divided common electrodes 156 are made difficult to be visually recognized, and the display device 100 provides a high quality image.

Embodiment 2

Figure 7:
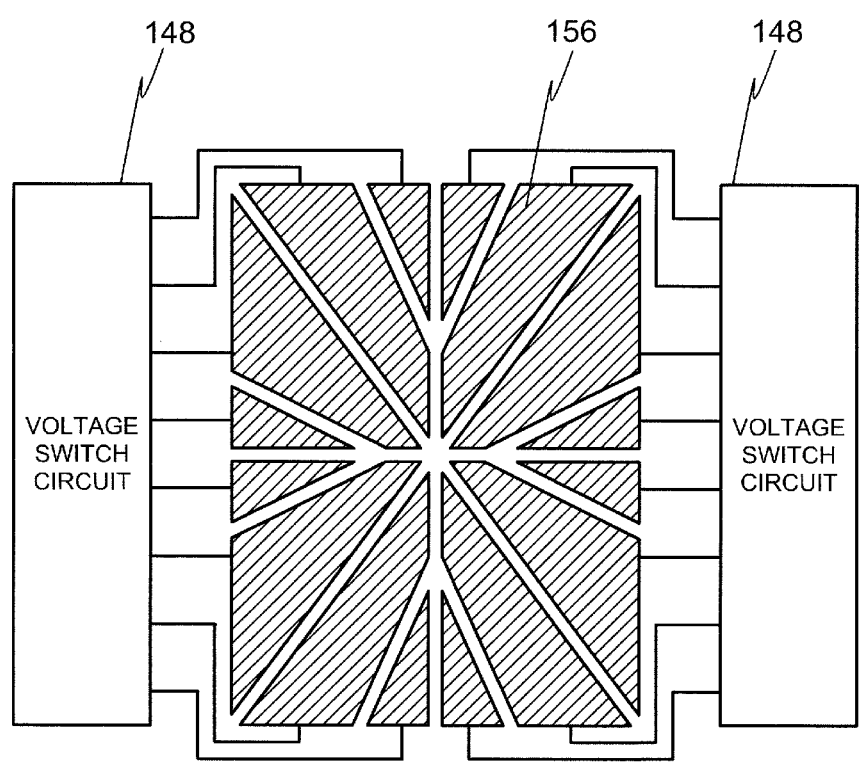
FIG. 7 is a schematic view showing a layout and a connection state of a plurality of divided common electrodes included in a display device in an embodiment according to the present invention.

With reference to a figure, a structure of a display device 200 in this embodiment will be described. FIG. 7 is a schematic view showing a layout of the divided common electrodes 156 in the display device 200 in this embodiment.

The display device 200 in this embodiment is different from the display device 100 in embodiment 1 in the layout of the divided common electrodes 156. FIG. 7 shows neither the reference power supply circuit 136 nor the scanning circuit 150, but these circuits are connected as in FIG. 4.

In the display device 200 in this embodiment, the common electrode 156 is divided into a greater number of areas than in the display device 100. Specifically, the common electrode 156 is divided into 16 polygonal (triangular or quadrangular) areas. In the display device 100, the apexes of the eight triangular divided common electrodes 156 are all concentrated in the central portion of the display region 106. Therefore, the number of the divided common electrodes 156 per unit area is smaller in the peripheral portion than in the central portion of the display device 106. For this reason, the precision of the touch panel in the peripheral portion of the display region 106 is lower than the precision of the touch panel in the central portion of the display region 106. By contrast, in the display device 200 in this embodiment, the number of the divided common electrodes 156 is larger in a portion far from the central portion (i.e., the peripheral portion) than in the central portion of the display region 106.

With such a structure, the precision of the touch panel is improved in the peripheral portion of the display region 106.

Embodiment 3

Figure 8:
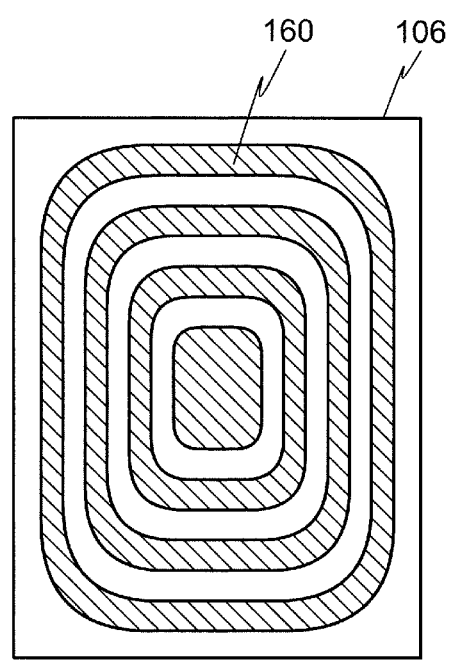
FIG. 8 is a plan view showing a layout of detection electrodes included in a display device in an embodiment according to the present invention.

With reference to a figure, a structure of a display device 300 in this embodiment will be described. FIG. 8 is a schematic view showing a layout of the detection electrodes 160 in the display device 300 in this embodiment. The display device 300 in this embodiment is different from the display device 100 in embodiment 1 in the layout of the detection electrodes 160.

In the display device 300 in this embodiment, the detection electrodes 160 are located in a substantially concentric pattern.

With such a structure, the plurality of divided common electrodes 156 extending in a radial direction and the plurality of detection electrodes 160 cross each other substantially perpendicularly at a great number of positions. This realizes a precise electrostatic capacitance-type touch panel.

Embodiment 4

Figure 9:
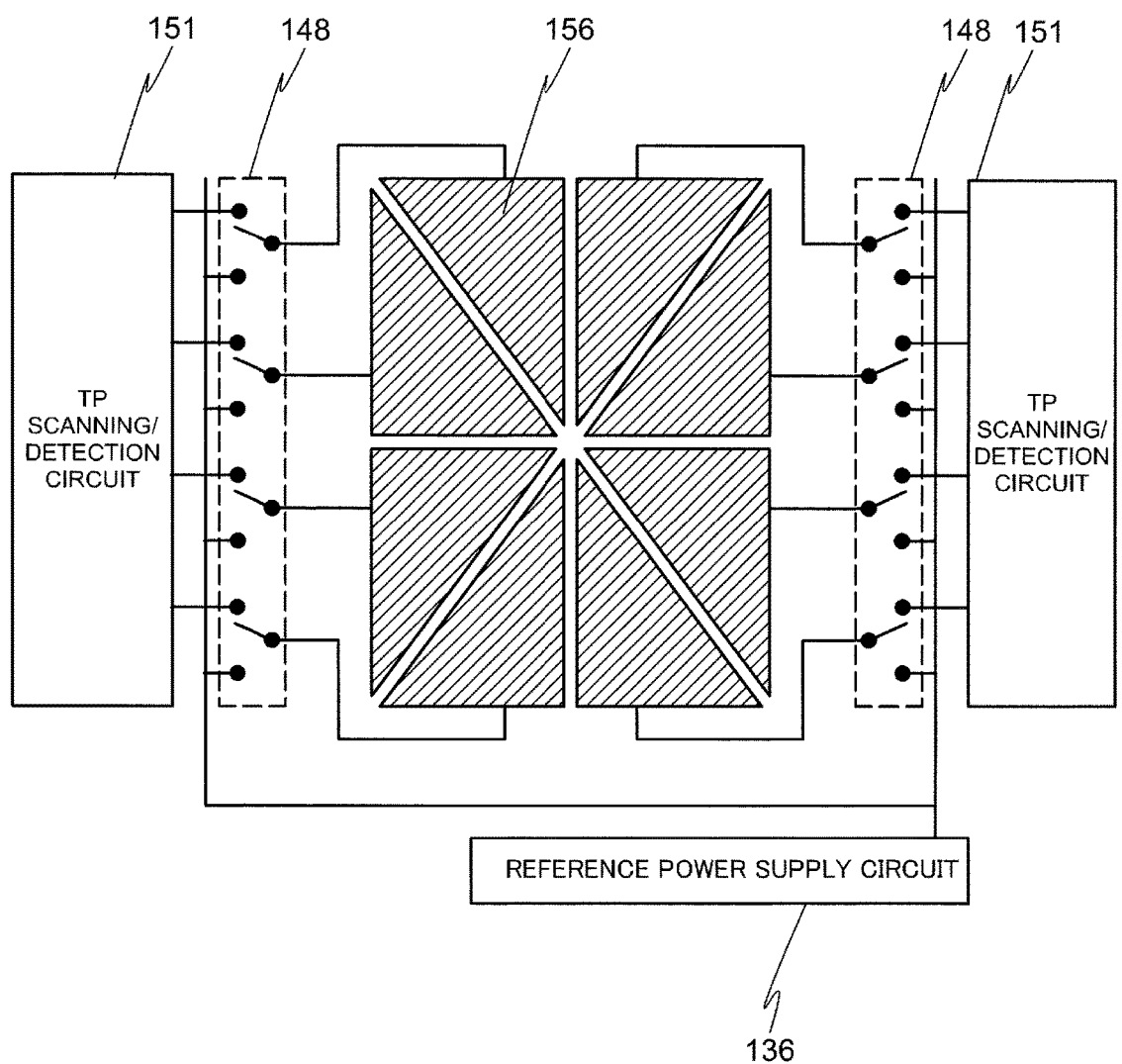
FIG. 9 is a schematic view showing a layout and a connection state of a plurality of divided common electrodes included in a display device in an embodiment according to the present invention.

With reference to a figure, a structure of a display device 400 in this embodiment will be described. FIG. 9 is a schematic view showing a layout and a connection state of the divided common electrodes 156 in the display device 400 in this embodiment.

The display device 400 in this embodiment is different from the display device 100 in embodiment 1 in the method for detecting the touch position. The layout of the divided common electrodes 156 is the same as that in the display device 100. However, unlike in the display device 100, the plurality of divided common electrodes 156 are independently connected with a TP (Touch Panel) scanning/detection circuit 151 via the voltage switch circuit 148.

A single layer of the plurality of divided common electrodes 156 may be included in a touch panel. Since the divided common electrodes 156 are triangular, the time constant to the TP scanning/detection circuit 151 varies in accordance with the touch position. With such an arrangement, the touch position may be detected by calculating the distance from an edge of the display region 106 to the touch position.

Such a structure simplifies the production process of the display device 400. Thus, the display device 400 is produced at lower cost.

Embodiment 5

Figure 10:
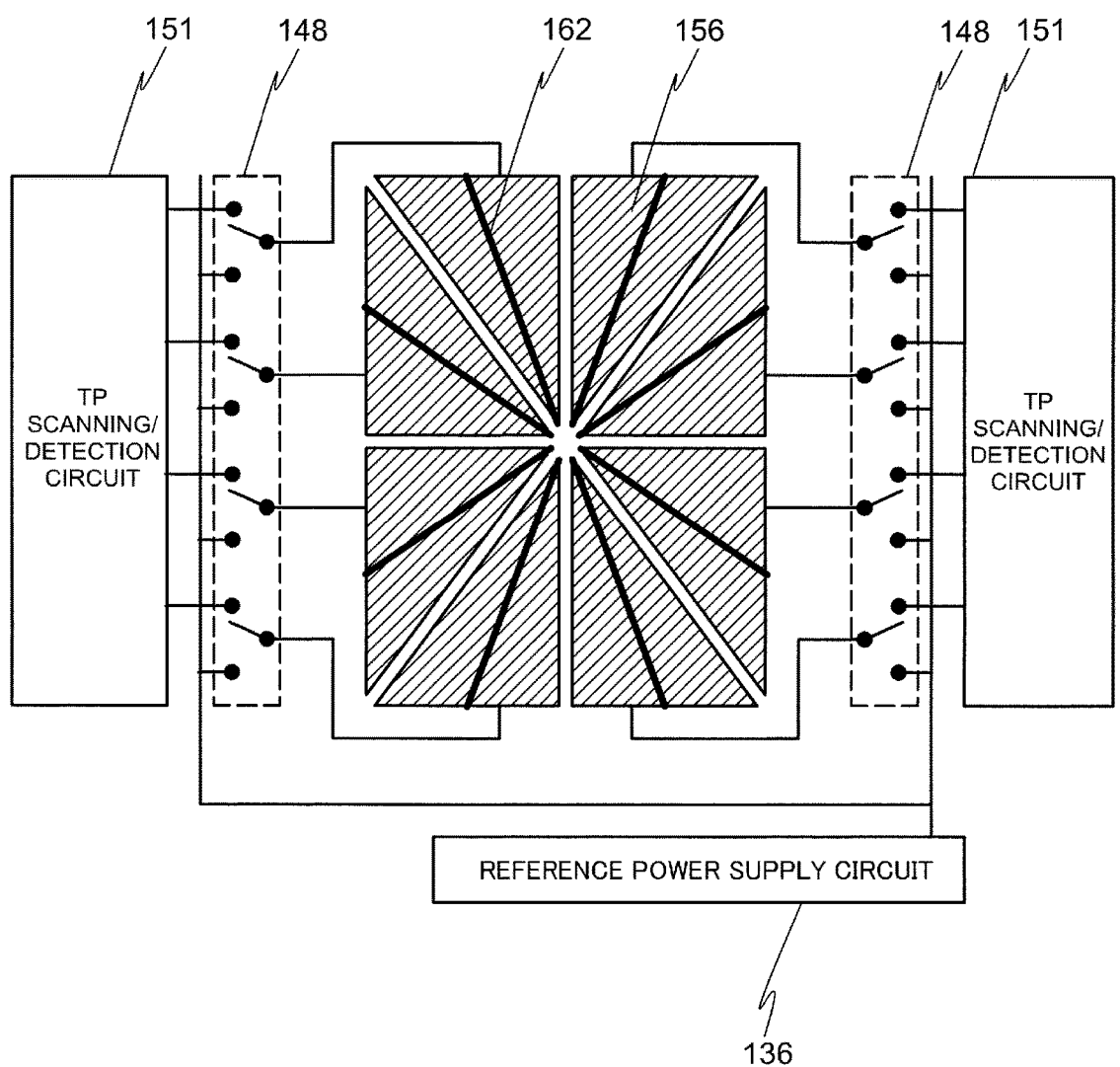
FIG. 10 is a schematic view showing a layout and a connection state of a plurality of divided common electrodes included in a display device in an embodiment according to the present invention.

With reference to a figure, a structure of a display device 500 in this embodiment will be described. FIG. 10 is a schematic view showing a layout and a connection state of the divided common electrodes 156 in the display device 500 in this embodiment.

Unlike the display device 400 in embodiment 4, the display device 500 in this embodiment further includes a plurality of subsidiary electrodes 162 provided to be electrically connected with the plurality of divided common electrodes 156 respectively. In this example, the subsidiary electrodes 162 are each located to extend in a straight line from the apex of the corresponding divided common electrode 156 to pass the center of gravity of the triangle of the corresponding divided common electrode 156. The apex is located in the central portion of the display region 106.

With such a structure, the resistance of each of the plurality of divided common electrodes 156 extending in a radial direction is decreased. Therefore, the voltage drop of each of the divided common electrodes 156 is suppressed in the display period, and the shapes of the divided common electrodes 156 are made difficult to be visually recognized. Thus, the display device 500 provides a high quality image.

Embodiment 6

Figure 11:
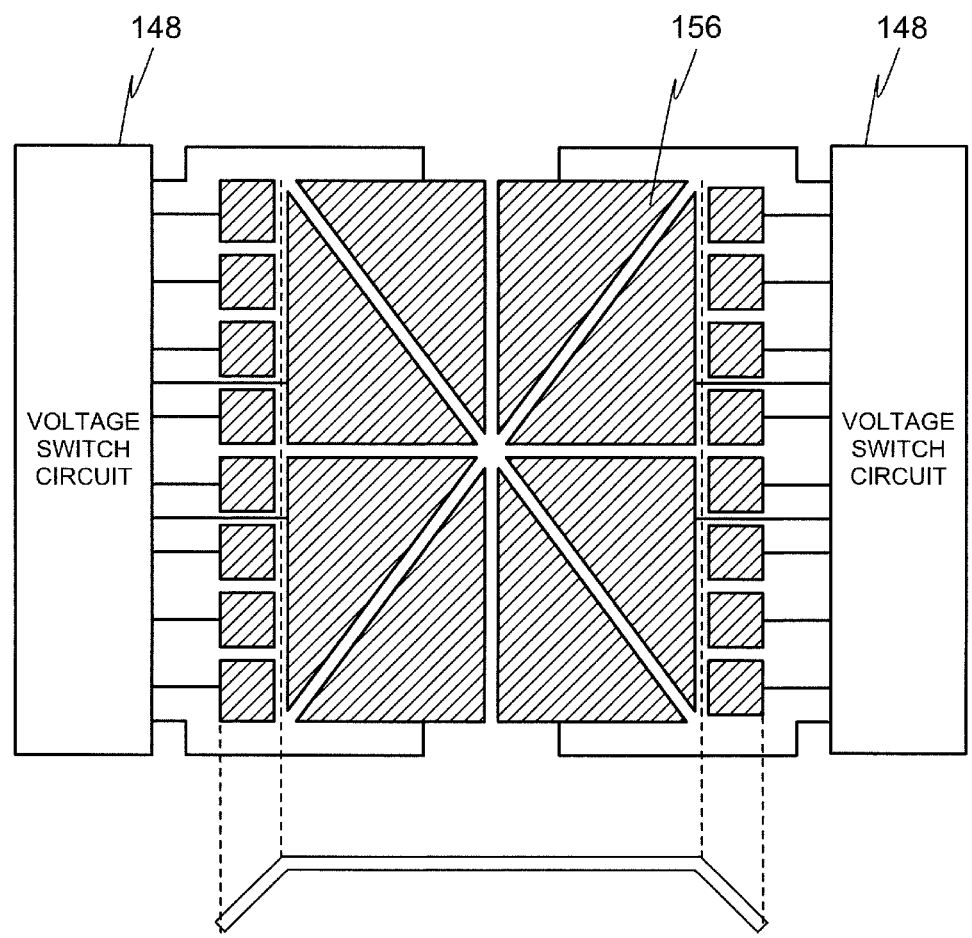
FIG. 11 is a schematic view showing a layout and a connection state of a plurality of divided common electrodes included in a display device in an embodiment according to the present invention.

With reference to a figure, a structure of a display device 600 in this embodiment will be described. FIG. 11 is a schematic view showing a layout and a connection state of the divided common electrodes 156 in the display device 600 in this embodiment. FIG. 11 shows neither the reference power supply circuit 136 nor the scanning circuit 150, but these circuits are connected as in FIG. 4.

In the display device 600 in this embodiment, the first substrate 102 is flexible. The first substrate 102 having flexibility may be formed of a substrate containing an organic resin such as, for example, polyimide.

In the display device 600 in this embodiment, the common electrode 156 is divided in a different pattern from that in the display device 100 in embodiment 1. In the display device 600, a central rectangular portion of the common electrode 156 is divided into a plurality of common electrodes 156 extending in a radial direction, and two rectangular portions of the common electrode 156 along two sides of the display region 106 facing each other are divided into a plurality of quadrangular common electrodes 156.

The display device 600 in this embodiment is assumed to be used as being folded. FIG. 11 shows, in a bottom part, a shape of a side surface of the display device 600 in the state of being folded. In this example, the display device 600 is folded along two of the lines along which the common electrode 156 is divided.

Namely, the plurality of divided common electrodes 156 may have a division pattern in conformity to the shape of the display device 600 in a folded state.

With such a structure, the divided common electrodes 156 are suppressed from being cracked when the display device 600 is folded. Thus, the flexible display device 600 provides high reliability.

Embodiment 7

Figure 12:
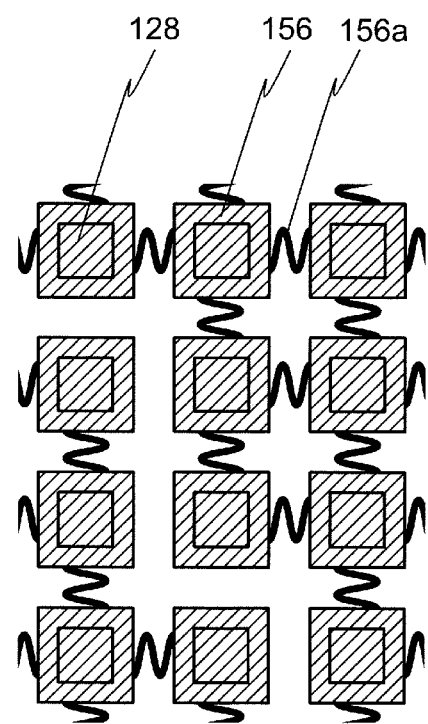
FIG. 12 is an enlarged view of an end portion of a display region including a plurality of common electrodes in a display device in an embodiment according to the present invention.

With reference to a figure, a structure of a display device 700 in this embodiment will be described. FIG. 12 is an enlarged view of an end portion of the display region 106 including a plurality of common electrodes 156 in the display device 700 in this embodiment.

The display device 700 in this embodiment is different from the display device 100 in embodiment 1 in the fine structure of the common electrodes 156. In the display device 700 in this embodiment, a plurality of common electrodes 156 are provided separately in correspondence with the plurality of pixels 108. The plurality of separate common electrodes 156 are connected with each other by folded lines 156a, and the common electrodes 156 connected in this manner are seen as the common electrode 156 being divided into a plurality of areas as shown in FIG. 3 macroscopically.

It is preferable that the folded lines 156a are formed of a metal material that is difficult to be visually recognized from outside and has a low resistance. The folded lines 156a may be formed of, for example, Al, Mg, Cu, Ti or the like.

With such a structure, the common electrodes 156 are suppressed from being cracked when the display device 700 is folded. Thus, the display device 700, which is flexible, provides high reliability.

The display devices 100 through 700 in preferable embodiments according to the present invention are described above. These embodiments are merely examples, and the technological scope of the present invention is not limited to any of the embodiments. For example, the light-emitting elements 128 in the display devices described above are organic light-emitting diodes. The light-emitting elements 128 are not limited to organic light-emitting diodes. For example, the light-emitting elements 128 may be quantum dot light-emitting diodes. In fact, a person of ordinary skill in the art would make various alterations without departing from the gist of the present invention. Therefore, such alterations are to be construed to be encompassed in the technological scope of the present invention.

What is claimed is:

1. A display device, comprising:
a substrate;
a display region provided on the substrate, the display region including an array of a plurality of pixels each including at least one light-emitting element;
a scanning line driving circuit sequentially scanning the plurality of pixels;
a video signal driving circuit sequentially inputting a video signal to the scanned plurality of pixels;
a common electrode commonly provided for the plurality of light-emitting elements, the common electrode being divided into a plurality of divided areas extending in a radial direction in the display region; and
a voltage switch circuit connected with the plurality of divided areas of the common electrode, the voltage switch circuit selectively connecting each of the plurality of divided areas of the common electrode with a reference power supply circuit supplying a constant potential or a scanning circuit detecting a touch position in the display region, wherein
the substrate is flexible,
the display region has a flat region and a folded region, wherein the folded region is provided along a side of the display region,
the plurality of the divided areas includes a plurality of first divided areas and a plurality of second divided areas,
a first shape of the plurality of first divided areas is different from a second shape of the plurality of second divided areas, and
the plurality of first divided areas is arranged in the flat region and the plurality of second divided areas is arranged in the folded region.

2. The display device according to claim 1, wherein at least one of the plurality of divided areas of the common electrode is triangular or quadrangular.

3. The display device according to claim 1, wherein the plurality of divided areas of the common electrode extending in the radial direction extend from a substantially central position of the display region.

4. The display device according to claim 3, wherein the plurality of divided areas of the common electrode respectively act as scanning electrodes of a touch panel;
the display device further comprising detection electrodes provided in the display region, the detection electrodes respectively crossing the scanning electrodes.

5. The display device according to claim 4, wherein the detection electrodes are located in a spiral pattern.

6. The display device according to claim 4, wherein the detection electrodes are located in a substantially concentric pattern.

7. The display device according to claim 1, wherein the plurality of divided areas of the common electrode provide a touch panel by themselves.

8. The display device according to claim 1, further comprising a plurality of subsidiary electrodes respectively provided for the plurality of divided areas of the common electrode.

9. The display device according to claim 1, wherein any one of the plurality of first divided areas and the plurality of second divided areas is not provided at a boundary between the flat region and the folded region.

10. The display device according to claim 1, wherein the light-emitting elements are organic light-emitting diodes.

11. The display device according to claim 1, wherein the light-emitting elements are quantum dot light-emitting diodes.

12. The display device according to claim 1, wherein the plurality of divided areas of the common electrode act as scanning electrodes of a touch panel,
the display device further comprising detection electrodes provided above the scanning electrodes.

13. A display device, comprising:
a substrate;
a display region provided on the substrate, the display region including an array of a plurality of pixels each including at least one light-emitting element;
a peripheral circuit enclosing the display region;
a common electrode commonly provided for the plurality of light-emitting elements, the common electrode being divided into a plurality of divided areas extending in a radial direction in the display region; and
a plurality of detection electrodes located on the plurality of divided areas of the common electrode with an insulating layer being provided between the plurality of detection electrodes and the plurality of divided areas of the common electrode;
wherein the peripheral circuit includes:
a touch detection circuit connected with the plurality of detection electrodes; and
a voltage switch circuit connected with the plurality of divided areas of the common electrode, the voltage switch circuit selectively connecting each of the plurality of divided areas of the common electrode with a reference power supply circuit supplying a constant potential or a scanning circuit detecting a touch position in the display region,
the substrate is flexible,
the display region has a flat region and a folded region, wherein the folded region is provided along a side of the display region, the plurality of the divided areas includes a plurality of first divided areas and a plurality of second divided areas, a first shape of the plurality of first divided areas is different from a second shape of the plurality of second divided areas, and the plurality of first divided areas is arranged in the flat region and the plurality of second divided areas is arranged in the folded region.

14. The display device according to claim 13, wherein the plurality of divided areas of the common electrode respectively act as scanning electrodes of a touch panel.

15. The display device according to claim 14, wherein the detection electrodes are located in a spiral pattern.

16. The display device according to claim 14, wherein the detection electrodes are located in a substantially concentric pattern.

17. The display device according to claim 13, further comprising a plurality of subsidiary electrodes respectively provided for the plurality of divided areas of the common electrode.

18. The display device according to claim 13, wherein, there is not any of the plurality of first divided areas and the plurality of second divided areas in a boundary between the first region and the folded region.

19. The display device according to claim 13, wherein the light-emitting elements are organic light-emitting diodes.

* * * * *